(12) United States Patent
Do

(10) Patent No.: US 6,950,357 B2
(45) Date of Patent: Sep. 27, 2005

(54) TEST MODE FLAG SIGNAL GENERATOR OF SEMICONDUCTOR MEMORY DEVICE

(75) Inventor: Chang-Ho Do, Ichon (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 10/835,709

(22) Filed: Apr. 29, 2004

(65) Prior Publication Data

US 2004/0252564 A1 Dec. 16, 2004

(30) Foreign Application Priority Data

Apr. 29, 2003 (KR) .................................. 10-2003-0026910

(51) Int. Cl.⁷ .................................................. G11C 7/00
(52) U.S. Cl. ...................................... 365/201; 365/233
(58) Field of Search .................................. 365/201, 233, 365/189.12; 714/42

(56) References Cited

U.S. PATENT DOCUMENTS 6,373,764 B2 * 4/2002 Fujioka ....................... 365/205
6,519,719 B1 * 2/2003 Manning ...................... 714/42

* cited by examiner

Primary Examiner—Son T. Dinh
(74) Attorney, Agent, or Firm—Blakely, Sokoloff, Taylor & Zafman

(57) ABSTRACT

A test mode flag signal generator for use in a semiconductor memory device includes a test mode decoder for generating M numbers of test mode flag signals; and an auxiliary test mode flag signal generating means for generating $M \times 2^N$ numbers of test mode flag signals by using N numbers of external signals and the M numbers of test mode flag signals.

8 Claims, 4 Drawing Sheets

TEST MODE FLAG SIGNAL GENERATOR OF SEMICONDUCTOR MEMORY DEVICE

FIELD OF INVENTION

The present invention relates to a semiconductor device; and, more particularly, to an auxiliary test mode flag signal generator included in a semiconductor memory device for testing operations of the semiconductor memory device.

DESCRIPTION OF PRIOR ART

As a memory capacity of a semiconductor memory device is increased and the semiconductor memory device is highly integrated, a possibility of errors during a manufacturing process is increased. Therefore, it is required to test the semiconductor memory device by using a test mode in order to determine whether or not the semiconductor memory device is normally operated.

In a test mode, if the semiconductor memory device performs a single test, e.g., a test for measuring a self refresh period and a timing margin between internal operations, a plurality of test mode flag signals are required. Herein, during the test mode, it is effective to be able to perform a lot of various and detail operations in the semiconductor memory device. Therefore, because the semiconductor memory device recently becomes more complicated and larger, a large number of test mode flag signals are required in order to perform various tests.

If a large numbers of tests are performed, a time taken for finding errors may be shortened to thereby effectively reduce a product development period for the semiconductor memory device.

FIG. 1 is a block diagram showing a conventional test mode flag signal generator employed in a conventional semiconductor memory device.

As shown, the conventional test mode flag signal generator includes an input signal generation unit 10, a command decoder 11, a test mode register set signal generation unit 12, a test mode address latch unit 13 and a test mode decoder 14.

The input signal generation unit 10 receives an external clock signal CLK, an external address signal ADD and a command signal CMD for generating a chip selection signal cs, a column address strobe signal cas, a row address strobe signal ras, a write enable signal we, an 8-bit internal address signal a<0:7>. Herein, the least significant bit of the 8-bit internal address signal a<0:7>, i.e., a 1-bit internal address signal a<7> is inputted to the test mode register set signal generation unit 12, and the other bits of the 8-bit internal address signal a<0:7>, i.e., a 7-bit internal address signal a<0:6> is inputted to the test mode address latch unit 13.

The command decoder 11 receives the chip selection signal cs, the column address strobe signal cas, the row address strobe signal ras and the write enable signal we for generating a mode register set pulse signal mrsp.

The test mode register set signal generation unit 12 generates a test mode register set signal tmrset in response to the mode register set pulse signal mrsp and the 1-bit internal address signal a<7>.

The test mode address latch unit 13 receives the 7-bit internal address signal a<0:6> for generating a test mode address signal tm_a<0:6> in response to the test mode register set signal tmrset.

The test mode decoder 14 generates 128 test mode flag signals TEST<0> to TEST<127> by using the test mode address signal tm_a<0:6> in response to the test mode register set signal tmrset. Herein, since the test mode address signal tm_a<0:6> is a 7-bit signal, there can be 128 different test mode flag signals. The test mode decoder 14 also receives a reset bar signal resetb to terminate a test mode operation.

The conventional test mode flag signal generator generates the 128 test mode flag signals TEST<0> to TEST<127> by using the 7-bit internal address signal a<0:6> when a mode register set (MRS) is inputted and the 1-bit internal address signal a<7> is in a logic HIGH level.

However, some of the 128 test mode flag signals TEST<0> to TEST<127> can not be used because there are some combinations of each bit of the 7-bit internal address signal a<0:6> which are may not be used. It is because the 1-bit internal address a<7> is not directly inputted to the test mode decoder 14. The test mode register set signal generation unit 12 outputs the test mode register set signal tmrset to the test mode decoder 14 after logically combining the mode register set pulse signal mrsp and the 1-bit internal address signal a<7>. Although the test mode decoder 14 can ideally generate 128 valid test mode flag signals, the test mode decoder 14 usually generates 64 to 128 valid test mode flag signals by using the combination of the test mode register set signal tmrset and the 7-bit internal address signal a<0:6>. Herein, those flag signals are not enough to test required functions of the semiconductor memory device.

As described above, it is difficult to generate the required numbers of test mode flag signals only by employing the conventional test mode flag signal generator. In addition, as the semiconductor memory device is more complicated, the more test mode flag signals are needed.

SUMMARY OF INVENTION

It is, therefore, an object of the present invention to provide a semiconductor device to generate required numbers of test mode flag signals.

In accordance with an aspect of the present invention, there is provided an auxiliary test mode flag signal generator for use in a semiconductor memory device including a test mode decoder for generating M numbers of test mode flag signals; and an auxiliary test mode flag signal generating means for generating M×2$^N$ numbers of test mode flag signals by using N numbers of external signals and the M numbers of test mode flag signals.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a test mode flag signal generator in accordance with the present invention will be described in detail referring to the accompanying drawings.

Figure 1:
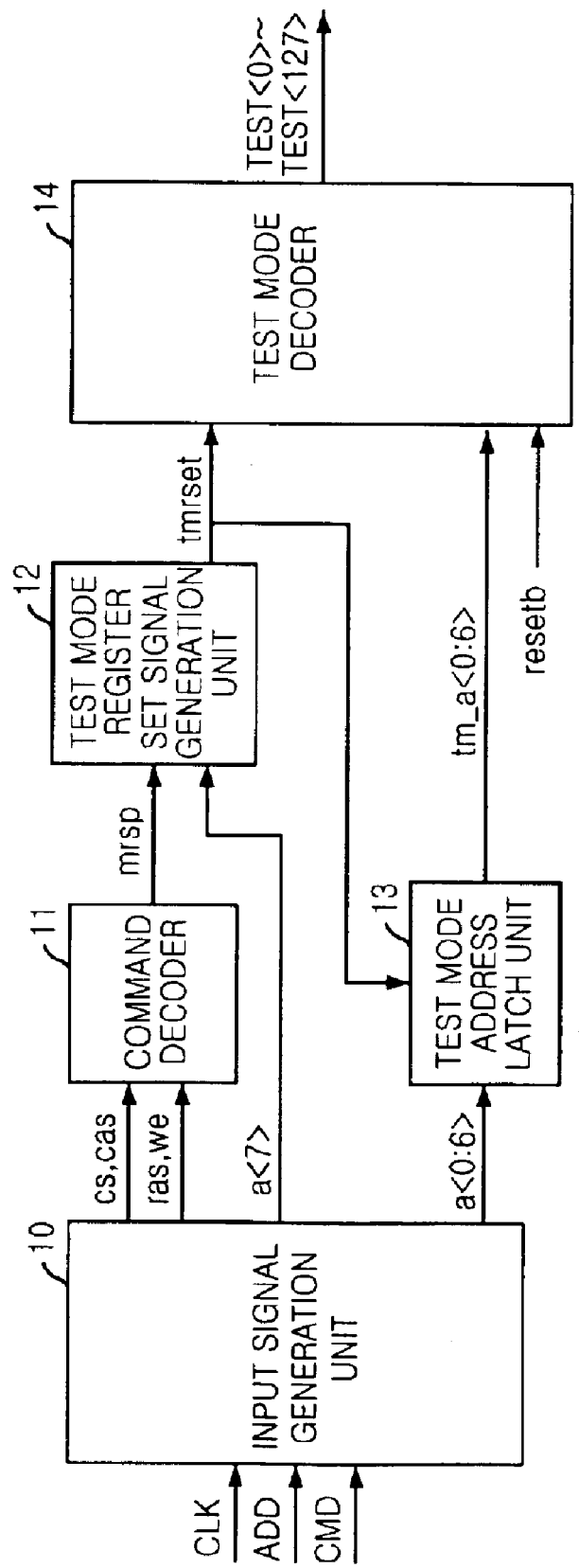
FIG. 1 is a block diagram showing a conventional test mode flag signal generator of a conventional semiconductor memory device.
Figure 2:
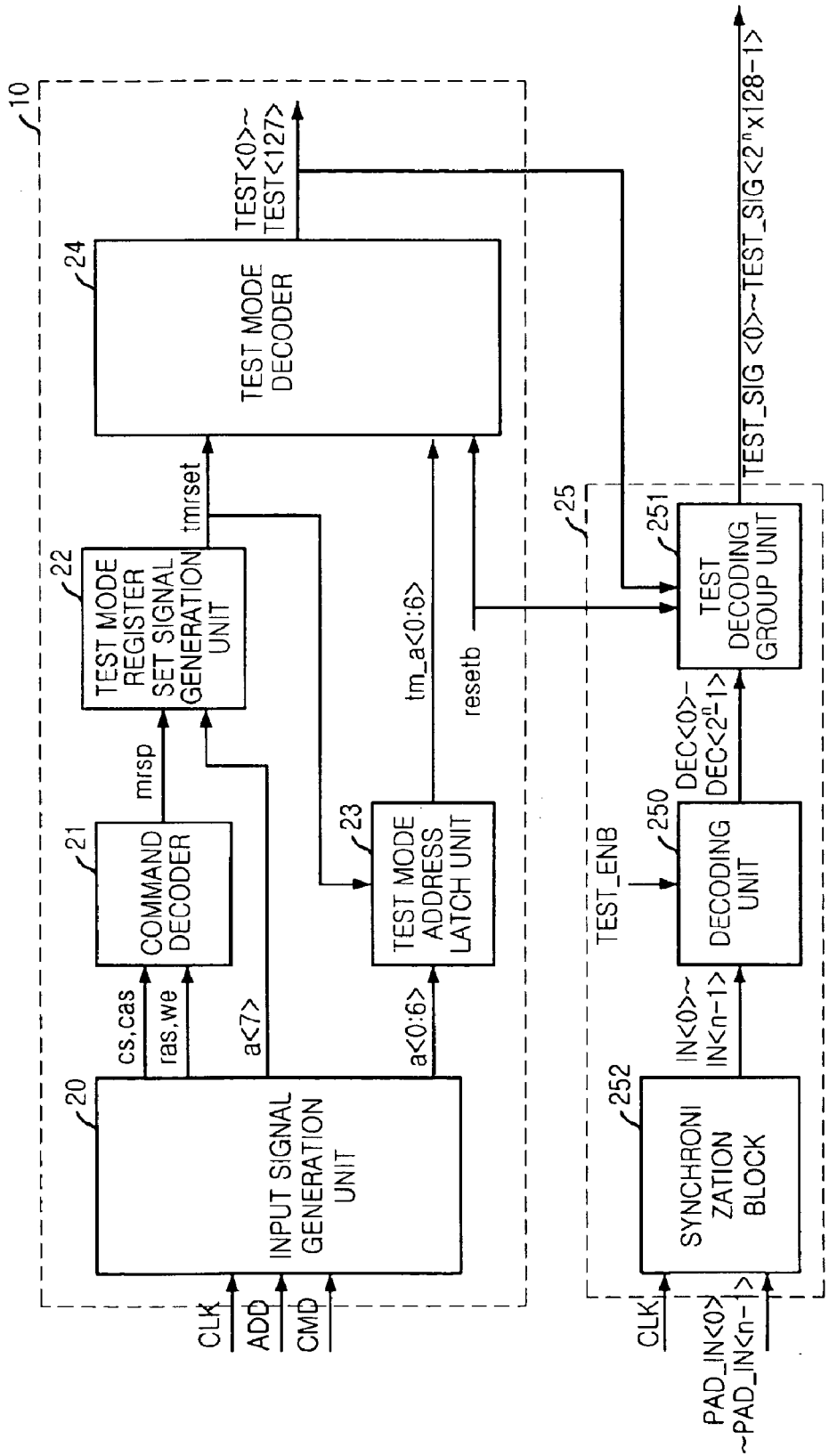
FIG. 2 is a block diagram showing a test mode flag signal generator in accordance with the present invention.

FIG. 2 is a block diagram showing a test mode flag signal generator-employed in a semiconductor memory device in accordance with the present invention.

As shown, the test mode flag signal generator includes a test mode flag signal generation unit 10 and an auxiliary test mode flag signal generation unit 25. In detail, the test mode flag signal generation unit 10 includes an input signal generation unit 20, a command decoder 21, a test mode register set signal generation unit 22, a test mode address latch unit 23 and a test mode decoder 24.

The input signal generation unit 20 receives an external clock signal CLK, an external address signal ADD and a command signal CMD for generating a chip selection signal cs, a column address strobe signal cas, a row address strobe signal ras, a write enable signal we, an 8-bit internal address signal a<0:7>. Herein, the least significant bit of the 8-bit internal address signal a<0:7>, i.e., a 1-bit internal address signal a<7> is inputted to the test mode register set signal generation unit 22, and the other bits of the 8-bit internal address signal a<0:7>, i.e., a 7-bit internal address signal a<0:6> is inputted to the test mode address latch unit 23.

The command decoder 21 receives the chip selection signal cs, the column address strobe signal cas, the row address strobe signal ras and the write enable signal we for generating a mode register set pulse signal mrsp.

The test mode register set signal generation unit 22 generates a test mode register set signal tmrset in response to the test mode register set pulse signal mrsp and the 1-bit internal address signal a<7>.

The test mode address latch unit 23 receives the 7-bit internal address signal a<0:6> for generating a test mode address signal tm_a<0:6> in response to the test mode register set signal tmrset.

The test mode decoder 24 generates 128 numbers of test mode flag signals TEST<0> to TEST<127> by using the test mode address signal tm_a<0:6> in response to the test mode register set signal tmrset. Herein, since the test mode address signal tm_a<0:6> is a 7-bit signal, 128 different test mode flag signals, i.e., the 128 numbers of test mode flag signals TEST<0> to TEST<127> can be generated depending on combination of each bit of the test mode address signal tm_a<0:6>.

Furthermore, the auxiliary test mode flag signal generation unit 25 includes a synchronization block 252, a decoding unit 250 and a test decoding group unit 251.

In detail, the synchronization block 252 receives n numbers of pad-in signals PAD_IN<0> to PAD_IN<n-1> and the external clock signal CLK to output n numbers of input signals IN<0> to IN<n-1> synchronized with the external clock signal CLK wherein n is a positive integer and n number of address signals can be employed as the pad-in signals.

The decoding unit 250 generates $2^n$ numbers of decoded signals DEC<0> to DEC<$2^n-1$> by decoding the n-bit input signal IN<0:n-1> in response to a test enable bar signal TEST_ENB. That is, for example, if the bit number of the input signals IN<0:M-1> is M (herein, M is a positive integer), the number of decoded signals DEC<0:$2^M-1$> is $2^M$.

The test decoding group unit 251 receives the 128 numbers of test mode flag signals TEST<0> to TEST<127> and the $2^n$ numbers of decoded signals DEC<0> to DEC<$2^n-1$> for generating $2^n \times 128$ numbers of auxiliary test mode flag signals TEST_SIG<0> to TEST_SIG<$2^n \times 128-1$>.

Herein, the test mode decoder 24 and the test decoding group unit 251 also receive a reset bar signal resetb to terminate a test mode.

Figure 3:
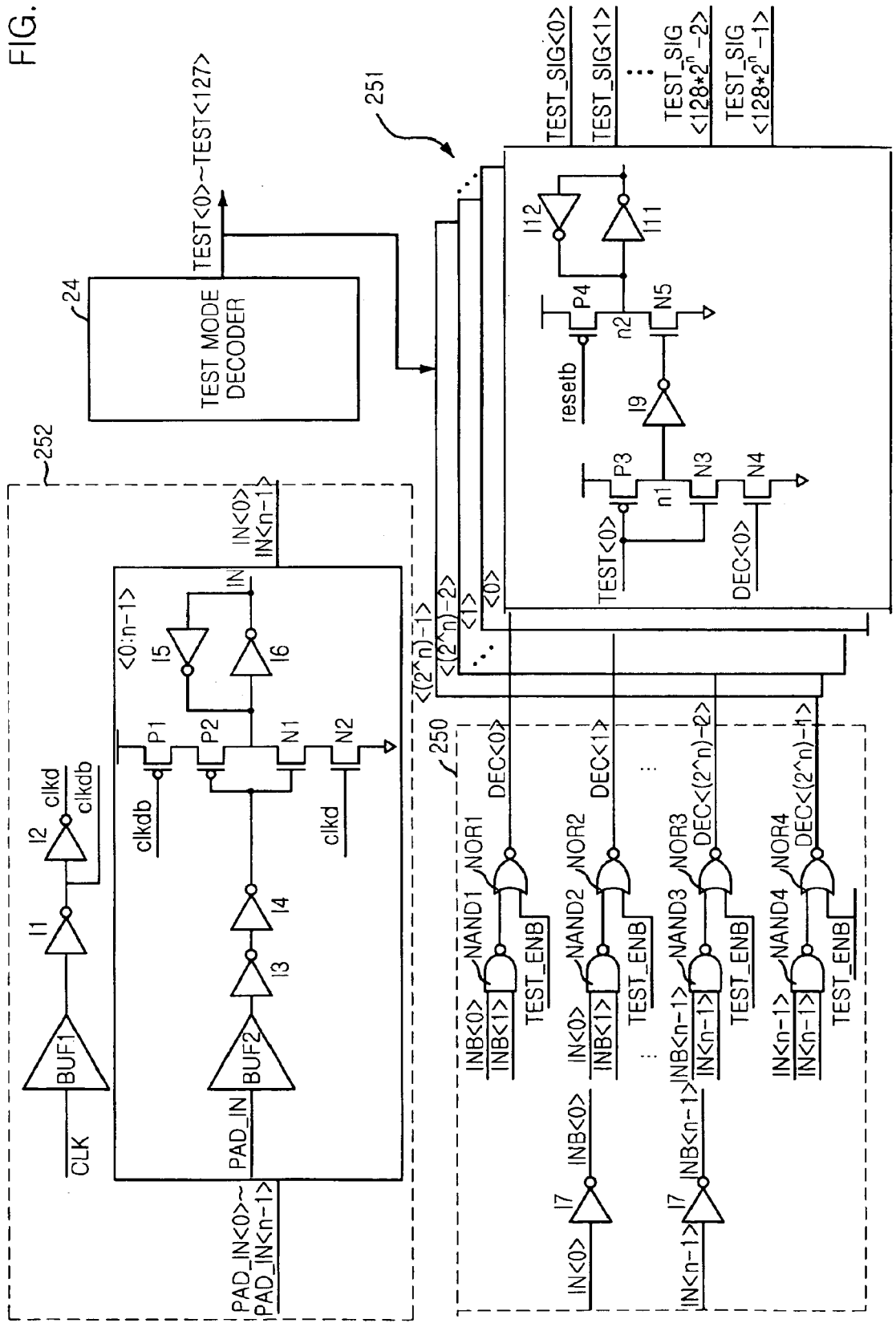
FIG. 3 is a schematic circuit diagram showing a partial portion of an auxiliary test mode flag signal generator shown in FIG. 2.

FIG. 3 is a schematic circuit diagram showing a partial portion of the auxiliary test mode flag signal generation unit 25 having the synchronization block 252, the decoding unit 250 and 128 test decoding group units 251.

First of all, as shown, the synchronization block 252 includes a first buffer BUF1, a second buffer BUF2, a first p-channel metal oxide semiconductor (PMOS) transistor P1, a second PMOS transistor P2, a first n-channel metal oxide semiconductor (NMOS) transistor N1, a second NMOS transistor N2 and a first to a sixth inverters I1 to I6.

The first buffer BUFL receives the external clock signal CLK for buffering the external clock signal CLK. The first inverter I1 receives an output signal from the first buffer BUF1 to output a clock bar signal clkdb which is an inverted signal of the external clock signal CLK. The second inverter I2 receives an output signal from the first inverter I1 to output a delayed clock signal clkd which is a delayed signal of the external clock signal CLK.

The second buffer BUF2 receives the n numbers of pad-in signals PAD_IN<0> to PAD_IN<n-1> for buffering the n numbers of pad-in signals PAD_IN<0> to PAD_IN<n-1>. The third and the fourth inverters I3 and I4 serve to delay an output signal from the second buffer BUF2.

The first PMOS transistor P1, the second PMOS transistor P2, the first NMOS transistor N1 and the second NMOS transistor N2 are connected in series. That is, a source and a drain of the first PMOS transistor P1 are respectively connected to a power supply voltage and a source of the second PMOS transistor P2. A drain of the first NMOS transistor N1 is connected to a drain of the second PMOS transistor P2. A drain and a source of the second NMOS transistor N2 are respectively connected to a source of the first NMOS transistor N1 and a ground voltage.

A gate of the first PMOS transistor P1 receives the clock bar signal clkdb and a gate of the second NMOS transistor N2 receives the delayed clock signal clkd.

Gates of the second PMOS transistor P2 and the first NMOS transistor N1 are connected each other and are also connected to an output terminal of the fourth inverter I4.

The second PMOS transistor P2 and the first NMOS transistor N1 serve to invert an output signal from the fourth inverter I4 and to output the inverted signal through drains of the second PMOS transistor P2 and the first NMOS transistor N1.

The fifth and the sixth inverters I5 and I6 receive an output signal from the drains of the second PMOS transistor P2 and the first NMOS transistor N1 to thereby output the n numbers of input signals IN<0> to IN<n-1> after latching the received output signal.

The n numbers of pad-in signals PAD_IN<0> to PAD_IN<n-1> are outputted as the n numbers of input signals IN<0> to IN<n-1> after being delayed for a predetermined time at a rising edge of the external clock signal CLK.

That is, assuming that there are two pad-in signals PAD_IN<0> and PAD_IN<1>, when the pad-in signals PAD_IN<0> and PAD_IN<1> are in a logic HIGH level, if the external clock signal CLK rises to a logic HIGH level, the first PMOS transistor P1 and the second NMOS transistor N2 are turned-on, whereby the pad-in signals PAD_IN<0> and PAD_IN<1> are respectively outputted as the input signals IN<0> and IN<1>. Thereafter, when the external clock signal CLK falls to a logic LOW level, since the first PMOS transistor P1 and the second NMOS transistor N2 are turned-off, the input signals IN<0> and IN<1> keep their logic values.

That is, logic values of the n numbers of input signals IN<0> to IN<n−1> are determined by logic values of the n numbers of pad-in signals PAD_IN<0> to PAD_IN<n−1> at a rising edge of the external clock signal CLK.

Thus, the synchronization block 252 can output n numbers of input signals IN<0> to IN<n−1> synchronized with the external clock signal CLK.

Next, the decoding unit 251 includes a seventh inverter I7, an eighth inverter I8, a first to a fourth NAND gates NAND1 to NAND4 and a first to a fourth NOR gates NOR1 to NOR4. Herein, although the decoding unit 251 includes a plurality of inverters, a plurality of NAND gates and a plurality of NOR gates in order to output the decoded signals DEC<0:$2^N$−1> after receiving the input signals IN<0:N−1>, a partial portion of the decoding unit related to the first and the last input signals IN<0> and IN<n−1> is described.

The seventh and the eighth inverters I7 and I8 serve to invert the n numbers of input signals IN<0> and IN<n−1> to thereby output inverted input signals INB<0> and INB<n−1>.

The first to the fourth NAND gates NAND1 to NAND4 perform a logic NAND operation respectively to the inverted input signals INB<0> and INB<1>; the input signal IN<0> and the inverted input signal INB<1>; the inverted input signal INB<0> and the input signal IN<1>; the input signals IN<0> and IN<1>.

Each of the first to the fourth NOR gates NOR1 to NOR4 receives the test enable bar signal TEST_ENB, and the first to the fourth NOR gates NOR1 to NOR4 respectively receive output signals from the first to the fourth NAND gates NAND1 to NAND4 to thereby output 4 decoded signals DEC<0> to DEC<3>. That is, the decoding unit 250 can generate the 4 decoded signals DEC<0> to DEC<3> by using the input signals IN<0> and IN<1>.

Moreover, the auxiliary test mode flag signal generation unit 25 has 128 test decoding group units in response to the test mode flag signals TEST<0> to TEST<127> outputted from the test mode decoder 24. As shown in FIG. 3, each test mode decoding unit 251 includes a third PMOS transistor P3, a fourth PMOS transistor P4, a third to a fifth NMOS transistors N3 to N5 and a ninth to an eleventh inverter I9 to I11.

The third PMOS transistor P3, the third and the fourth NMOS transistors N3 and N4 are connected in series. That is, the third PMOS transistor P3 is connected between the power supply voltage and the third NMOS transistor N3, and the fourth NMOS transistor N4 is connected between the third NMOS transistor N3 and the ground voltage.

Gates of the third PMOS transistor P3 and the third NMOS transistor N3 receive one of the 128 test mode flag signals TEST<0> to TEST<127>. Herein, it is assumed that the gates of the third PMOS transistor P3 and the third NMOS transistor N3 receive the test mode flag signal TEST<0>.

The fourth NMOS transistor N4 is connected between the third NMOS transistor N3 and the ground voltage, and a gate of the fourth NMOS transistor N4 receives one of the 4 decoded signals DEC<0> to DEC<3>

The ninth inverter I9 inverts an output signal from drains of the third PMOS transistor P3 and the third NMOS transistor N3. The fifth NMOS transistor N5 is connected between the forth PMOS transistor P4 and the ground voltage, and a gate of the fifth NMOS transistor N5 receives an output signal from the ninth inverter I9.

The fourth PMOS transistor P4 is connected between the power supply voltage and the fifth NMOS transistor N5, and a gate of the fourth PMOS transistor P4 receives the reset bar signal resetb.

The tenth and the eleventh inverters I10 and I11 form a latch for receiving an output signal from drains of the fourth PMOS transistor P4 and the fifth NMOS transistor N5 to thereby output the auxiliary test mode flag signals TEST_SIG<0> to TEST_SIG<4>.

If the test mode register set signal tmrset is activated as a logic HIGH level, the test mode flag signal TEST<0> is activated as a logic HIGH level. While the test mode flag signal TEST<0> is in a logic HIGH level, the auxiliary test mode flag signals TEST_SIG<0> to TEST_SIG<4> are generated. Since the test mode flag signal TEST<0> and the reset bar signal resetb are in a logic HIGH level, the third and the fourth PMOS transistors P3 and P4 are turned-off.

If the decoded signal DEC<0> becomes in a logic HIGH level due to the input signal IN<0>, the fourth NMOS transistor N4 is turned-on. Therefore, a first node n1 becomes in a logic LOW level, and the fifth NMOS transistor N5 is turned-on since an output signal from the ninth inverter I9 is in a logic HIGH level. As a result, since a second node n2 becomes in a logic LOW level, the auxiliary test mode flag signal TEST_SIG<0> outputted from the eleventh inverter I11 becomes in a logic HIGH level.

Thereafter, until the reset bar signal resetb is generated, the auxiliary test mode flag signal TEST_SIG<0> keeps its logic level even though the decoded signal DEC<0> changes its logic level. That is, if the reset bar signal resetb is activated as a logic LOW level, the test mode flag signal TEST<0> becomes in a logic LOW level, and the auxiliary test mode flag signal TEST_SIG<0> becomes in a logic LOW level because the third and the fourth PMOS transistors P3 and P4 are turned-on and the third to the fifth NMOS transistors N3 to N5 are turned-off.

As described above, the decoding unit 250 and the test decoding group unit 251 generate four different test mode flag signals by using a single test mode flag signal and two pad-in signals. Therefore, the decoding unit 250 and the test decoding group unit 251 can generate $2^n \times 128$ numbers of test mode flag signals by using the 128 numbers of test signals TEST<0> to TEST<127> and the n numbers of pad-in signals PAD_IN<0> to PAD_IN<n−1>.

Figure 4:
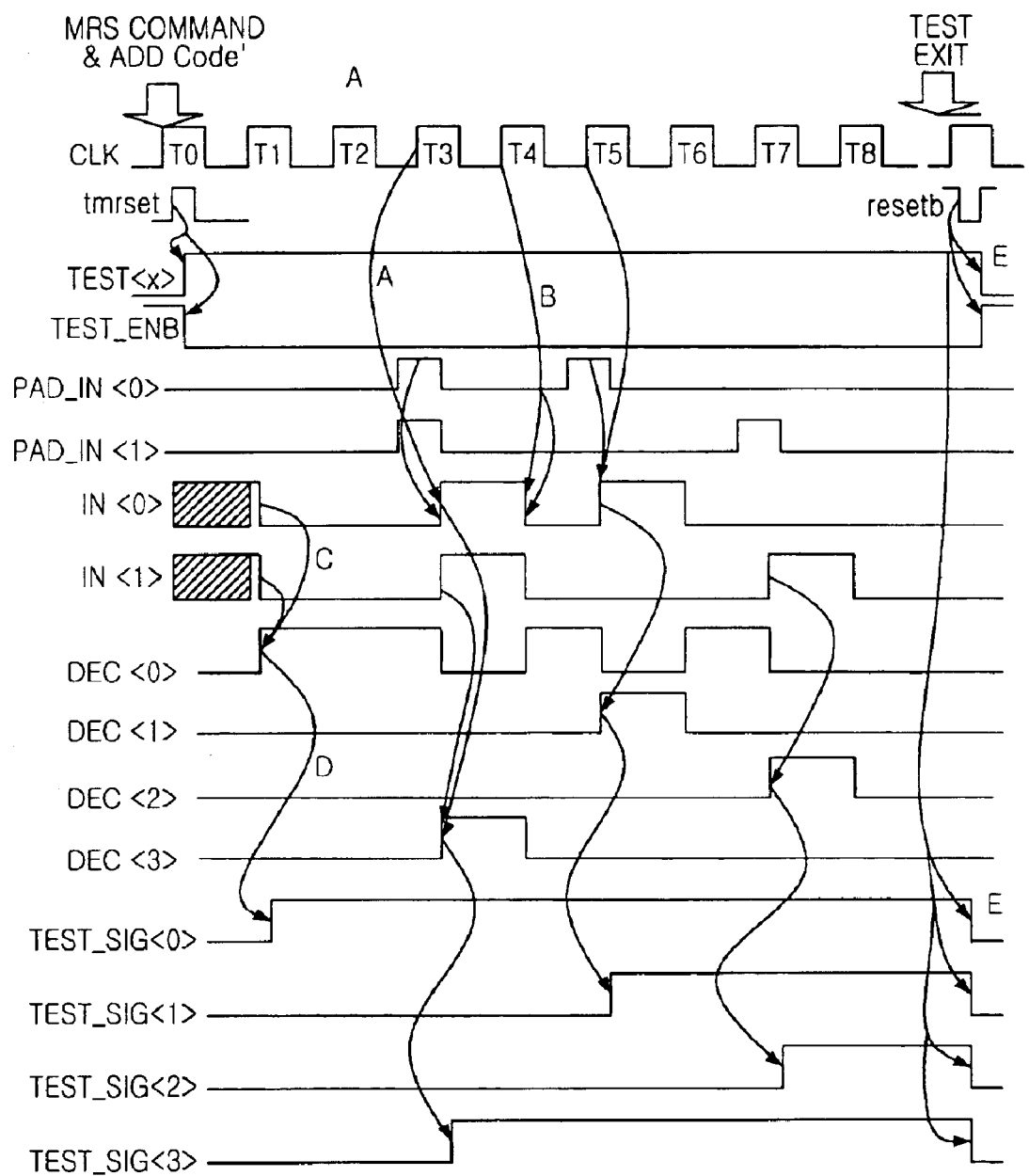
FIG. 4 is a timing diagram showing an operation of the test mode flag signal generator in accordance with the present invention.

FIG. 4 is a timing diagram showing an operation of the test mode flag signal generator in accordance with the present invention.

The operation of the test mode flag signal generator is described below referring to FIGS. 2 to 4.

If a mode register set (MRS) and the external address signal ADD are inputted and the 1-bit internal address signal a<7> becomes logic HIGH level at a rising edge of the external clock signal CLK during a time period T0, the test mode register set signal tmrset is activated as a logic HIGH level.

Then, one of the 128 numbers of test mode flag signals TEST<0> to TEST<127>, i.e., TEST<x> is activated as a logic HIGH level in response to the test mode register set signal tmrset. Herein, the x is 0 or a natural number between 1 and 127 and is determined by the 7-bit internal address signal a<0:6>. The test enable bar signal TEST_ENB is also activated as a logic LOW level in response to the test mode register set signal tmrset.

Thereafter, if the test mode flag signal test<x> is inputted to the test decoding group unit 251, the test decoding group unit 251 generates the $2^n \times 128$ numbers of test mode flag signals TEST<0> to TEST<$2^n \times 128$−1>.

That is, on the assumption that the n is 2, if both of the pad-in signals PAD_IN<0> and PAD_IN<1> are in a logic LOW level at a rising edge of the external clock signal CLK during a time period T1, both of the input signals IN<0> and IN<1>become in a logic LOW level. Thereafter, the decoding unit 250 activates the decoded signal DEC<0> in response to the input signals IN<0> and IN<1> which are in a logic LOW level. As a result, the test decoding group unit 251 activates the auxiliary test mode flag signal TEST_SIG<0> in response to the decoded signal DEC<0>. The test mode flag signals TEST_SIG<1>to TEST_SIG<3> are also activated depending on logic states of the input signals IN<0> and IN<1>.

Although the operation of the test mode flag signal generator is described above on the assumption that the number of the pad-in signals is two, the number of the pad-in signals can be larger than 2 to generate more test mode flag signals.

As shown in FIG. 2, if the number of the test mode flag signals is 128 and the number of the pad-in signals is n, $2^n \times 128$ different test mode flag signals can be generated.

As described above, the test mode flag signal generator in accordance with the present invention can generate $2^N \times M$ numbers of test mode flag signals by using M numbers of test mode flag signals and N numbers of external input signals.

Therefore, it is possible to generate enough test mode flag signals by using the test mode flag signal generator. As a result, it is easier than ever to find errors of a semiconductor memory device, and a product development period of a semiconductor memory device can be shortened.

While the present invention has been described with respect to the particular embodiments, it will be apparent to those skilled in the art that various changes and modifications may be made without departing from the spirit and scope of the invention as defined in the following claims.

What is claimed is:

1. A test mode flag signal generator for use in a semiconductor memory device, comprising:
   a test mode flag signal generating means for receiving a M-bit address signal and a plurality of command signals to thereby generate $2^M$ numbers of test mode flag signals; and
   an auxiliary test mode flag signal generating means for receiving the $2^M$ numbers of test mode flag signals and N number of source signals to thereby generate $2^M \times 2^N$ numbers of auxiliary test mode flag signals,
   wherein M and N are positive integers.

2. The test mode flag signal generator as recited in claim 1, wherein the test mode flag signal generating means includes:
   a synchronization block for receiving the N number of source signals and an external clock signal and generating N number of input signals synchronized with the external clock signal;
   a decoding unit for receiving the N number of input signals and generating $2^N$ number of decoded signals; and
   M number of test decoding group units, each for receiving the $2^N$ number of decoded signals and the M number of test mode flag signals to thereby generate $M \times 2^N$ numbers of test mode flag signals.

3. The test mode flag signal generator as recited in claim 2, wherein the input signal generating means generates a chip selection signal, a column address strobe signal, a row address strobe signal, a write enable signal and an internal address signal by using an external clock signal, an external address signal and a command signal, herein the internal address signal is a plural-bit signal.

4. The test mode flag signal generator as recited in claim 3 further includes:
   a command decoder which receives the chip selection signal, the column address strobe signal, the row address strobe signal and the write enable signal for generating a mode register set pulse signal;
   a test mode register set signal generation unit for generating a test mode register set signal in response to the mode register set pulse signal and the least significant bit of the internal address signal; and
   a test mode address latch unit for generating a test mode address signal in response to the test mode register set signal and the internal address signal except for the least significant bit, herein the test mode address signal is a plural-bit signal.

5. The test mode flag signal generator as recited in claim 4, wherein the test mode decoder generates the M numbers of test mode flag signals by using the test mode register set signal in response to the test mode register set signal.

6. The test mode flag signal generator as recited in claim 5, wherein the decoding unit includes:
   a plurality of NAND gates which receive the N numbers of input signals and inverted signals of the N numbers of input signals; and
   a plurality of OR gates which receive a test mode enable bar signal and output signals from the plurality of NAND gates to thereby output $2^N$ numbers of decoded signals.

7. The test mode flag signal generator as recited in claim 6, wherein the test decoding group includes:
   a first PMOS transistor whose gate and source are respectively connected to one of the M numbers of test mode flag signals and a power supply voltage;
   a first NMOS transistor whose gate and drain are respectively connected to the gate of the first PMOS transistor and a drain of the first PMOS transistor;
   a second NMOS transistor which is connected between a source of the first NMOS transistor and a ground voltage and a gate of the second NMOS transistor is controlled by the $2^N$ numbers of decoded signals;
   a first inverter for inverting output signal from the drain of the first PMOS transistor or the first NMOS transistor;
   a third NMOS transistor whose gate and source are respectively connected to an output terminal of the first inverter and the ground voltage;
   a second PMOS transistor which is connected between the power supply voltage and a drain of the third NMOS transistor and a gate of the second PMOS transistor receives a reset bar signal which serves to end a test mode;
   a second inverter for inverting an output signal from a drain of the third NMOS transistor to thereby output the $M \times 2^N$ numbers of test mode flag signals; and
   a third inverter connected with the second inverter in parallel, herein the second inverter and the third inverter form a latch.

8. The test mode flag signal generator as recited in claim 7, wherein the input signal generating means includes:
   a first buffer for buffering the external clock signal;
   a fourth inverter for inverting an output signal from the first buffer to thereby output a first output signal;

a fifth inverter for inverting the first output signal to thereby output a second output signal;

a second buffer for buffering the N numbers of external signals;

a sixth and a seventh inverters for delaying an output signal from the second buffer;

a third PMOS transistor and a fourth NMOS transistor for inverting an output signal from the seventh inverter;

a fourth PMOS transistor which is connected between the power supply voltage and a source of the third PMOS transistor and a gate of the fourth transistor is controlled by the first output signal;

a fifth NMOS transistor which is connected between the ground voltage and a source of the fourth NMOS transistor and a gate of the fifth NMOS transistor is controlled by the second output signal;

an eighth inverter for inverting an output signal from the third PMOS transistor and the fourth NMOS transistor to thereby output the N numbers of input signals; and a ninth inverter which is connected with the eight inverter in parallel, herein the eight and the ninth inverters form a latch.

* * * * *